United States Patent [19]
Ouellette et al.

[11] Patent Number: 5,889,442
[45] Date of Patent: Mar. 30, 1999

[54] CRYSTAL OSCILLATOR STARTING OPERATION IN AN ELECTRICITY METER

[75] Inventors: Maurice J. Ouellette, North Berwick, Me.; Gregory P. Lavoie, Lee, N.H.

[73] Assignee: General Electric Company, Schenectady, N.Y.

[21] Appl. No.: 857,398

[22] Filed: May 16, 1997

[51] Int. Cl.⁶ .............................. H03B 5/06; H03B 5/36; H03L 3/00; G01R 1/00

[52] U.S. Cl. .................. 331/173; 331/158; 327/142; 324/76.11

[58] Field of Search .................. 331/116 R, 116 FE, 331/158, 165–166, 172–174; 327/142, 143, 76.11

[56] References Cited

U.S. PATENT DOCUMENTS

| | | | |
|---|---|---|---|
| 2,905,907 | 9/1959 | Sanders | 331/173 |
| 3,381,533 | 5/1968 | Behrens | 331/173 X |
| 3,849,741 | 11/1974 | Groom, III et al. | 331/174 X |
| 4,485,818 | 12/1984 | Leckrone et al. | 331/158 X |
| 4,562,412 | 12/1985 | Sugawara et al. | 331/173 X |
| 4,833,427 | 5/1989 | Leuthold et al. | 331/165 |
| 5,010,307 | 4/1991 | Strandberg | 331/166 X |
| 5,126,695 | 6/1992 | Abe | 331/158 X |

Primary Examiner—David Mis
Attorney, Agent, or Firm—Carl B. Horton, Esq.

[57] ABSTRACT

Methods and apparatus for controlling operation of a low frequency oscillator upon reset of a microcomputer to achieve faster start-up time are described. In one aspect, the present invention is directed to a microcomputer having an oscillator input port, an oscillator output port, and an oscillator control port, and an oscillator coupled to the microcomputer oscillator output, input, and control ports. The microcomputer is programmed to control the output on the oscillator control port so that upon reset, the output transitions from a low state to a high state in accordance with a preselected frequency for a preselected period of time. More particularly, and in one exemplary embodiment, the microcomputer controls the output on the oscillator control port upon reset so that for a preselected cycle, the output is high for approximately about one-half cycle, low for approximately about one-half cycle, and then high for approximately about one-half cycle. Upon completion of such cycling, the microcomputer transitions the output on the control port to a high impedance state. Such control of the low frequency oscillator decreases the oscillator start-up time. Specifically, by generating the control signal having the desired frequency as described above, and then providing such control signal to the oscillator, the oscillator is "kick started" to begin its operations more quickly than such operations would begin without such control signal.

21 Claims, 2 Drawing Sheets

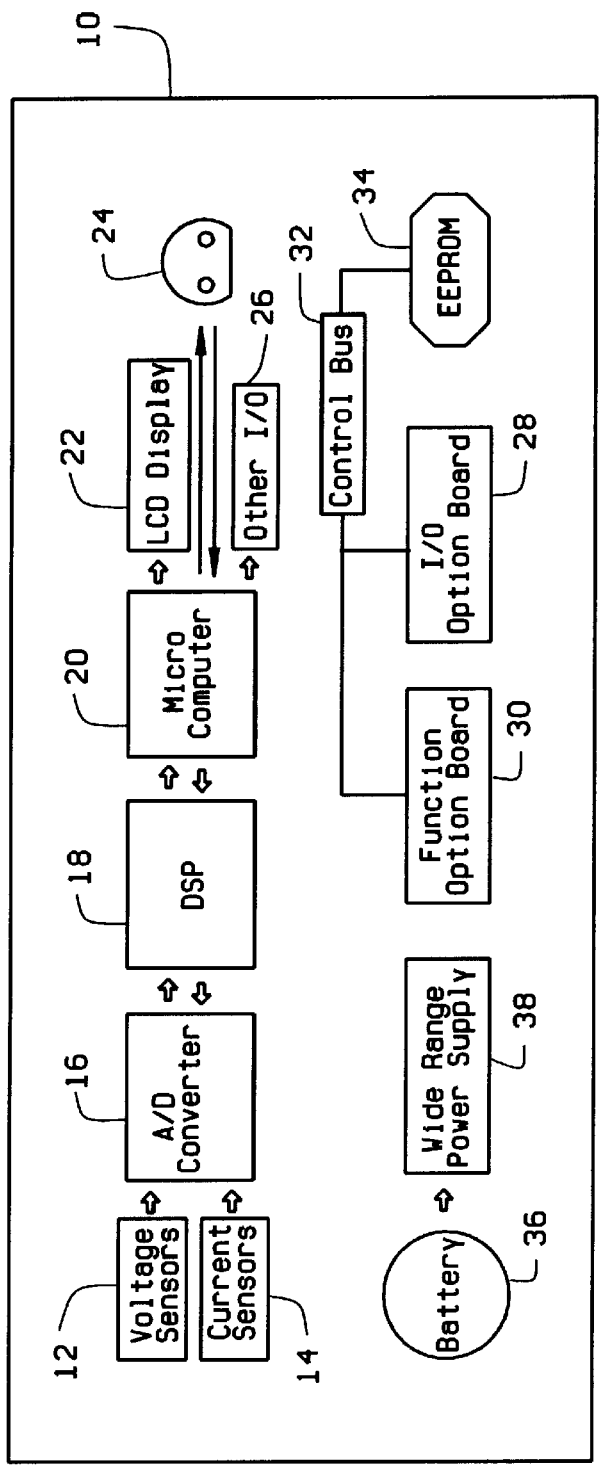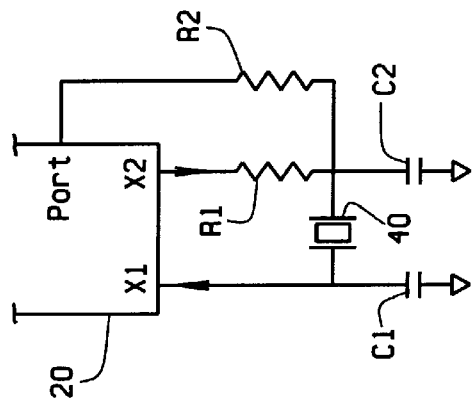

5,889,442

CRYSTAL OSCILLATOR STARTING OPERATION IN AN ELECTRICITY METER

FIELD OF THE INVENTION

This invention relates generally to electricity meters and, more particularly, to controlling oscillator operation during meter power-up operations.

BACKGROUND OF THE INVENTION

Known microcomputer based systems, such as electricity meters, utilize a basic master oscillator and a slower subclock oscillator. The subclock oscillator generates a signal having a frequency much lower than the basic master oscillator. Both the master oscillator and the subclock oscillator are crystal controlled.

Upon reset of the microcomputer (e.g., upon power-up), it is important that both the master oscillator and the subclock oscillator begin operating (i.e., oscillating) almost immediately. In an electricity meter, for example, such immediate operation is necessary in order to ensure a proper start-up and measurement of energy consumption. Low frequency oscillators, however, typically have a slow start-up time. Such slow start-up time may interfere with the desired operation of the meter which, of course, is undesirable.

Accordingly, it would be desirable to provide methods and apparatus for controlling operation of a low frequency oscillator so that such oscillator has a fast start-up time, at least as compared to the start-up times of known low frequency oscillators. Such methods and apparatus also preferably will not add significant costs in terms of components and circuit assembly time.

SUMMARY OF THE INVENTION

These and other objects may be attained by methods and apparatus for controlling operation of a crystal oscillator upon reset in accordance with the present invention. More particularly, and in one aspect, the present invention is directed to a microcomputer having an oscillator input port, an oscillator output port, and an oscillator control port, and an oscillator coupled to the microcomputer oscillator output, input, and control ports. The microcomputer is programmed to control the output on the oscillator control port so that upon reset, the output transitions from a low state to a high state in accordance with a preselected frequency for a preselected period of time. More particularly, and in one exemplary embodiment, the microcomputer controls the output on the oscillator control port upon reset so that for a preselected cycle, the output is high for approximately about one-half cycle, low for approximately about one-half cycle, and then high for approximately about one-half cycle. Upon completion of such cycling, the microcomputer transitions the output on the control port to a high impedance state.

In another aspect, the present invention is directed to a method for operating a microcomputer coupled to an oscillator at least at a control port of the microcomputer. The method comprises the step of generating a control signal at the output port for transmission to the oscillator upon reset of the microcomputer. Specifically, the microcomputer is controlled to output on the control port a control signal which transitions from a low state to a high state in accordance with a preselected frequency for a preselected period of time. In an exemplary embodiment, the control signal is high for approximately about one-half cycle, low for approximately about one-half cycle, and then high for approximately about one-half cycle. Upon completion of the cycling, the output on the control port is transitioned to a high impedance state.

The above described apparatus and method control operation of a low frequency oscillator so that such oscillator has a fast start-up time, at least as compared to the start-up times of known low frequency oscillators. Specifically, by generating the control signal having the desired frequency as described above, and then providing such control signal to the oscillator, the oscillator is "kick started" to begin its operations more quickly than such operations would begin without such control signal. Further, implementing such methods and apparatus does not add significant costs in terms of components and circuit assembly time.

BRIEF DESCRIPTION OF THE DRAWINGS

FIG. 1 is a block diagram of an exemplary electronic energy meter.

FIG. 2 is a circuit schematic of an oscillator control circuit in accordance with one embodiment of the present invention.

DETAILED DESCRIPTION

Figure 3:
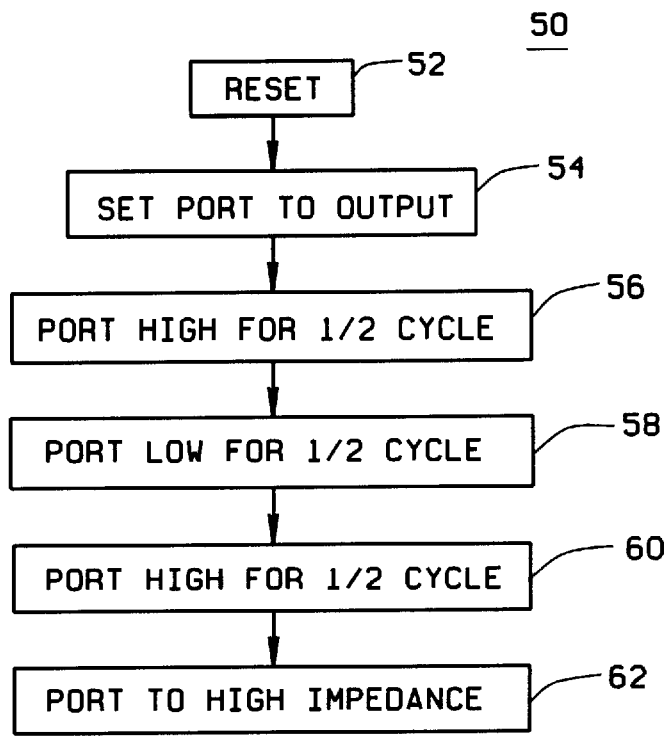
FIG. 3 is a flow chart illustrating a sequence of steps executed by the microcomputer shown in FIG. 1 to provide a desired oscillator operation upon reset in accordance with one embodiment of the present invention.

FIG. 1 is a block diagram illustration of an exemplary electronic energy meter 10 which, for example, is commercially available from General Electric Company, 130 Main Street, Somersworth, N.H. 03878, and generally referred to as the KV meter. The KV meter can be modified to incorporate the oscillator control as described below in more detail. Although the present apparatus and methods are described herein in the context of an electronic electricity meter, it should be understood that the present invention is not limited to practice with any one particular meter nor is the present invention limited to practice only in electricity meters. Rather, the present invention can be utilized in connection with other microcomputer based devices using an external crystal oscillator for timing or other functions.

Referring now specifically to FIG. 1, meter 10 includes voltage sensors 12 and current sensors 14. Sensors 12 and 14, in operation, typically are coupled to the power lines supplying power to site at which the meter is located. Sensors 12 and 14 are coupled to an analog to digital (A/D) converter 16 which converts the input analog voltage and current signal to digital signals. The output of converter 16 is provided to a digital signal processor (DSP) 18. DSP 18 supplies microcomputer 20 with digitized metering quantities, e.g., $V^2H$, $I^2H$. Microcomputer 20, using the metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display 22 to control the display of various selected metering quantities and to an optical communications port 24 to enable an external reader to communicate with computer 20. Port 24 may be the well known OPTOCOM™ port of General Electric Company, 130 Main Street, Somersworth, N.H. 03878, which is in accordance with the ANSI type II optical port. Microcomputer 20 may also generate additional outputs 26 used for various other functions as is well known in the art. Microcomputer 20 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20 also is coupled to an input/output (I/O) board 28 and to a function, or high function, board 30. DSP 18 also supplies outputs directly to high function board 30. Microcomputer 20 further is coupled, via a control bus 32, to an electronically erasable programmable read only memory (EEPROM) 34. I/O board 28 and high function board 30 also are coupled, via bus 32, to EEPROM 34.

Back-up power is supplied to the meter components described above by a battery 36 coupled to a wide range power supply 38. In normal operation when no back-up power is required, power is supplied to the meter components from the power lines via power supply 38.

Many functions and modifications of the components described above are well understood in the metering art. The present application is not directed to such understood and known functions and modifications. Rather, the present application is directed to the methods and apparatus for controlling power-up of a crystal oscillator as described below in more detail. In addition, although the methods and apparatus are described below in the hardware environment shown in connection with FIG. 1, it should be understood that such methods and apparatus are not limited to practice in such environment. The subject methods and apparatus could be practiced in many other environments.

Further, it should be understood that the present invention can be practiced with many alternative microcomputers, and is not limited to practice in connection with just microcomputer 20. Therefore, and as used herein, the term microcomputer is not limited to mean just those integrated circuits referred to in the art as microcomputers, but broadly refers to microcomputers, processors, microcontrollers, application specific integrated circuits, and other programmable circuits configured to couple to oscillators.

FIG. 2 is a circuit schematic of an exemplary oscillator control circuit in accordance with one embodiment of the present invention. More particularly, microcomputer 20 includes an oscillator input port (X1), an oscillator output port (X2), and an oscillator control port (Port). A low frequency (e.g., 32 kHz) resonator 40 is connected at its input to output port (X2) via a resistor (R1) and to control port (Port) via resistor (R2). Resonator 40 is connected at its output to input port (X1). Resonator 40 is connected across capacitors (C1 and C2), which are connected to ground.

The specific resistances and capacitances of resistor (R1 and R2) and capacitors (C1 and C2) selected depend, of course, upon the specific desired operation of the oscillator. Such resistances and capacitances, in one specific exemplary embodiment, can be selected to have the following values:

C1=C2=12 pF,

R1=100 kilo ohms, and

R2=100 kilo ohms.

Again, these values are selected based upon the desired operation of oscillator 40 and many other values can be selected.

Microcomputer 20 is programmed to control the output on oscillator control port (Port) so that upon reset, such output transitions from a low state to a high state in accordance with a preselected frequency for a preselected period of time. Such transitioning provides a "kick start" for oscillator in that by providing an oscillating control signal, the low frequency oscillator starts up much faster than would otherwise be possible without such control signal.

FIG. 3 is a flow chart 50 illustrating an exemplary sequence of steps executed by microcomputer 20 to provide a desired oscillator operation upon reset of microcomputer 20 in accordance with one embodiment of the present invention. More particularly, and in the exemplary embodiment, upon reset 50, microcomputer 20 selects to control the output on control port (Port) by selecting such port for output 54. Then, microcomputer 20 controls (or generates) the output on oscillator control port (Port) so that the output is high for approximately about one-half cycle 56 (a first cycle portion), low for approximately about one-half cycle 58 (a second cycle portion), and then high for approximately about one-half cycle 60 (a third cycle portion). In the exemplary embodiment, and upon completion of such cycling 56, 58, and 60, microcomputer 20 transitions the output on control port (Port) to a high impedance state 62. The oscillator (FIG. 2) then continues oscillating in its normal mode of oscillation. Of course, the present invention is not limited to cycle portions of about one-half cycle, and the cycle portions can be selected to be other than one-half cycle portions, e.g., one-third or one-eight. In addition, the first, second, and third cycle portions do not necessarily have to be equal to each other, e.g., the first cycle portion can be longer than the second and third cycle portions.

Figure 4:
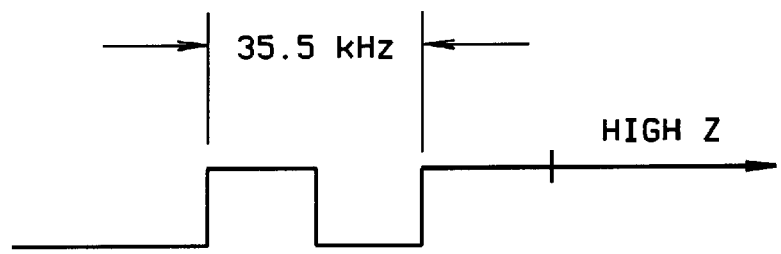
FIG. 4 is illustrates the signal present on the port of the microcomputer when microcomputer operations are controlled in accordance with the sequence of steps set forth in the flow chart illustrated in FIG. 3.

FIG. 4 illustrates the signal present on control port (Port) of microcomputer 20 when microcomputer operations are controlled in accordance with the sequence of steps set forth in flow chart 50. As shown in FIG. 4, the selected frequency for the control signal is 35.5 Khz. Of course, the selected frequency can vary and the present invention is not limited to any particular frequency for the control signal. In addition, more or fewer cycles could be used for such "kick start" operations of the low frequency oscillator, and the present invention is not limited to just one cycle as described above in the exemplary embodiment.

The above described apparatus and method control operation of a low frequency oscillator so that such oscillator has a fast start-up time, at least as compared to the start-up times of known low frequency oscillators. Specifically, by generating the control signal having the desired frequency as described above, and then providing such control signal to the oscillator, the oscillator is "kick started" to begin its operations more quickly than such operations would begin without such control signal. Further, implementing such methods and apparatus does not add significant costs in terms of components and circuit assembly time.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

We claim:

1. An electricity meter, comprising:

a microcomputer programmed to perform electricity metering functions, said microcomputer comprising an oscillator input port, an oscillator output port, and an oscillator control port; and an oscillator coupled to said microcomputer oscillator output, input, and control ports;

said microcomputer configured to control an output on said oscillator control port upon reset so that for a preselected cycle, the output is:
(a) high for a first cycle portion,
(b) low for a second cycle portion, and
(c) high for a third cycle portion.

2. An electricity meter in accordance with claim 1 wherein upon reset of said microcomputer, said microcomputer is programmed to control an output on said oscillator control port so that the output transitions from a low state to a high state in accordance with a preselected frequency for a preselected period of time.

3. An electricity meter in accordance with claim 1 wherein upon the completion of step (c), said microcomputer transitions the output on said control port to a high impedance state.

4. An electricity meter in accordance with claim 1 wherein the preselected cycle is about 35.5 kHz.

5. An electricity meter in accordance with claim 1 wherein said oscillator comprises a crystal resonator.

6. A microcomputer based system, comprising:
an oscillator; and
a microcomputer comprising an oscillator input port, an oscillator output port, and an oscillator control port, said input, output and control ports coupled to said oscillator, said microcomputer programmed to provide a control signal to said oscillator through said control port upon reset of said microcomputer, said microcomputer configured to control an output on said oscillator control port upon reset so that for a preselected cycle, the output is:
(a) in a first state for a first cycle portion,
(b) in a second state for a second cycle portion, and
(c) in said first state for a third cycle portion.

7. A system in accordance with claim 6 wherein upon reset of said microcomputer, said microcomputer is programmed to control an output on said oscillator control port so that the output transitions from a low state to a high state in accordance with a preselected frequency for a preselected period of time.

8. A system in accordance with claim 6 wherein said first state is a high state and said second state is a low state.

9. A system in accordance with claim 6 wherein upon the completion of step (c), said microcomputer transitions the output on said control port to a high impedance state.

10. A system in accordance with claim 6 wherein the preselected cycle is about 35.5 kHz.

11. A system in accordance with claim 6 wherein said oscillator comprises a crystal resonator.

12. A method for operating a microcomputer upon occurrence of a reset condition to start-up an oscillator, the microcomputer coupled to the oscillator at least at a control port of the microcomputer, said method comprising the step of operating the microcomputer, for a preselected cycle, to output on the control port a control signal which is:
(a) in a first state for a first cycle portion,
(b) in a second state for a second cycle portion, and
(c) in the first state for a third cycle portion.

13. A method in accordance with claim 12 wherein generating the control signal comprises the step of operating the microcomputer to output on the control port a control signal which transitions from a low state to a high state in accordance with a preselected frequency for a preselected period of time.

14. A method in accordance with claim 12 further comprising the step of generating a control signal at the output port for transmission to the oscillator upon reset of the microcomputer.

15. A method in accordance with claim 14 further comprising the step of, upon the completion of step (c), transitioning the output on the control port to a high impedance state.

16. A method in accordance with claim 14 wherein the preselected cycle is about 35.5 kHz.

17. An electricity meter, comprising:
an oscillator; and
a microcomputer comprising an oscillator input port, an oscillator output port, and an oscillator control port, said oscillator coupled to said microcomputer oscillator output, input, and control ports and configured to control an output on said oscillator control port so that for a preselected cycle, the output is:
(a) in a first state for a first cycle portion,
(b) in a second state for a second cycle portion, and
(c) in said first state for a third cycle portion.

18. An electricity meter in accordance with claim 17 wherein said microcomputer is configured to execute (a)–(c) upon an occurrence of a reset condition.

19. An electricity meter in accordance with claim 17 wherein said first state is a high state and said second state is a low state.

20. An electricity meter in accordance with claim 17 wherein upon the completion of said third cycle portion, said microcomputer transitions the output on said control port to a high impedance state.

21. An electricity meter in accordance with claim 17 wherein said oscillator comprises a resonator.

* * * * *